United States Patent
Lin et al.

(10) Patent No.: US 11,588,106 B2
(45) Date of Patent: Feb. 21, 2023

(54) METHOD TO EFFECTIVELY SUPPRESS HEAT DISSIPATION IN PCRAM DEVICES

(71) Applicant: Taiwan Semiconductor Manufacturing Co., Ltd., Hsin-Chu (TW)

(72) Inventors: Yu Chao Lin, Hsinchu (TW); Jui-Ming Chen, Zhunan Township (TW); Shao-Ming Yu, Zhubei (TW); Tung Ying Lee, Hsinchu (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 49 days.

(21) Appl. No.: 17/081,159

(22) Filed: Oct. 27, 2020

(65) Prior Publication Data
US 2021/0066590 A1 Mar. 4, 2021

Related U.S. Application Data

(62) Division of application No. 16/289,733, filed on Mar. 1, 2019, now Pat. No. 10,862,031.

(51) Int. Cl.
*H01L 45/00* (2006.01)
*H01L 27/24* (2006.01)

(52) U.S. Cl.
CPC ...... *H01L 45/1293* (2013.01); *H01L 27/2436* (2013.01); *H01L 45/06* (2013.01); *H01L 45/1233* (2013.01); *H01L 45/1675* (2013.01)

(58) Field of Classification Search
CPC . H01L 45/1293; H01L 27/2436; H01L 45/06; H01L 45/1233; H01L 45/1675; H01L 45/144; H01L 45/148
See application file for complete search history.

(56) References Cited

U.S. PATENT DOCUMENTS 5,320,981 A * 6/1994 Blalock ............ H01L 21/76804
257/E21.578
6,330,388 B1 * 12/2001 Bendett ................ G02B 6/1345
385/91
(Continued)

OTHER PUBLICATIONS

Limcharoen et al. "Characterisation of C—F Polymer Film Formation on the Air-Bearing Surface Etched Sidewall of Fluorine-Based Plasma Interacting with AL2O3—TiC Substrate." Journal of Nanomaterials, vol. 2013, Article ID 851489, 6 pages, published in 2013.

(Continued)

*Primary Examiner* — Galina G Yushina
(74) *Attorney, Agent, or Firm* — Eschweiler & Potashnik, LLC

(57) ABSTRACT

In some embodiments, the present disclosure relates to a method of forming an integrated chip that includes depositing a phase change material layer over a bottom electrode. The phase change material is configured to change its degree of crystallinity upon temperature changes. A top electrode layer is deposited over the phase change material layer, and a hard mask layer is deposited over the top electrode layer. The top electrode layer and the hard mask layer are patterned to remove outer portions of the top electrode layer and to expose outer portions of the phase change material layer. An isotropic etch is performed to remove portions of the phase change material layer that are uncovered by the top electrode layer and the hard mask layer. The isotropic etch removes the portions of the phase change material layer faster than portions of the top electrode layer and the hard mask layer.

20 Claims, 16 Drawing Sheets

(56) References Cited

U.S. PATENT DOCUMENTS

| | | | |
|---|---|---|---|
| 6,759,347 B1 | 7/2004 | Cheng et al. | |
| 9,793,135 B1* | 10/2017 | Zaitsu | H01L 21/02274 |
| 2006/0270102 A1 | 11/2006 | Chang et al. | |
| 2008/0044632 A1* | 2/2008 | Liu | H01L 45/06 |
| | | | 428/689 |
| 2010/0041230 A1 | 2/2010 | Witt | |
| 2010/0210068 A1 | 8/2010 | Lee et al. | |
| 2011/0111532 A1 | 5/2011 | Ryu et al. | |
| 2011/0180097 A1 | 7/2011 | Huseinovic et al. | |
| 2011/0272380 A1 | 11/2011 | Jeong et al. | |
| 2012/0001145 A1* | 1/2012 | Magistretti | H01L 45/1233 |
| | | | 977/755 |
| 2012/0193599 A1 | 8/2012 | Lung et al. | |
| 2012/0202333 A1 | 8/2012 | Breitwisch et al. | |
| 2012/0326109 A1 | 12/2012 | Liu et al. | |
| 2014/0339489 A1 | 11/2014 | Kim | |
| 2015/0028280 A1 | 1/2015 | Sciarrillo et al. | |
| 2016/0268505 A1* | 9/2016 | Sung | H01L 45/1253 |
| 2020/0005863 A1* | 1/2020 | Grobis | H01L 45/1675 |
| 2020/0006081 A1* | 1/2020 | Sherpa | C09K 13/00 |
| 2020/0203127 A1* | 6/2020 | Nishiyama | H01J 37/3244 |

OTHER PUBLICATIONS

Limcharoen et al. "A Polymer-Rich Re-deposition Technique for Non-volatile Etching By-products in Reactive Ion-Etching Systems." Chin. Phys. Lett. vol. 30, No. 7 (2013) 075202, published Jul. 2013.

University of Cambridge. "DoITPoMS—TLP Library The Glass Transition in Polymers—Measurement of." The date of publication is unknown. Retrieved online on Jan. 29, 2019 from https://www.doitpoms.ac.uk/tlplib/glass-transition/measurement.php.

Wikipedia.org "Inductively Coupled Plasma." Published on Jan. 9, 2019. Retrieved online on Jan. 29, 2019 from https://en.wikipedia.org/wiki/Inductively_coupled_plasma.

Wikipedia.org "Joule Heating." Published on Dec. 28, 2018. Retrieved online on Jan. 10, 2019 from https://en.wikipedia.org/wiki/Joule_heating.

Wikipedia.org "Phase-Change Memory." Published on Jan. 1, 2019. Retrieved online on Jan. 10, 2019 from https://en.wikipedia.org/wiki/Phase-change_memory.

Wikipedia.org "Phonon." Published on Jan. 10, 2019. Retrieved online on Jan. 28, 2019 from https://en.wikipedia.org/wiki/Phonon.

Fuxi et al. "Data Storage at the Nanoscale: Advances and Applications." Pan Stanford Publishing. ISBN: 9378-981-4613-20-0. Published on Jan. 28, 2015.

Non-Final Office Action dated May 1, 2020 for U.S. Appl. No. 16/289,733.

Notice of Allowance dated Aug. 11, 2020 for U.S. Appl. No. 16/289,733.

Wong et al. Phase Change Memory, Proceedings of the IEEE, vol. 98, No. 12, Dec. 2010, pp. 2201-2227.

* cited by examiner

METHOD TO EFFECTIVELY SUPPRESS HEAT DISSIPATION IN PCRAM DEVICES

REFERENCE TO RELATED APPLICATION

This application is a Divisional of U.S. application Ser. No. 16/289,733, filed on Mar. 1, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Phase-change random-access memory (PCRAM) devices are a type of non-volatile memory that are promising candidates for the next generation of non-volatile electronic memory as PCRAM devices provide faster speeds and lower power consumption while maintaining low manufacturing costs compared to other commonly used non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
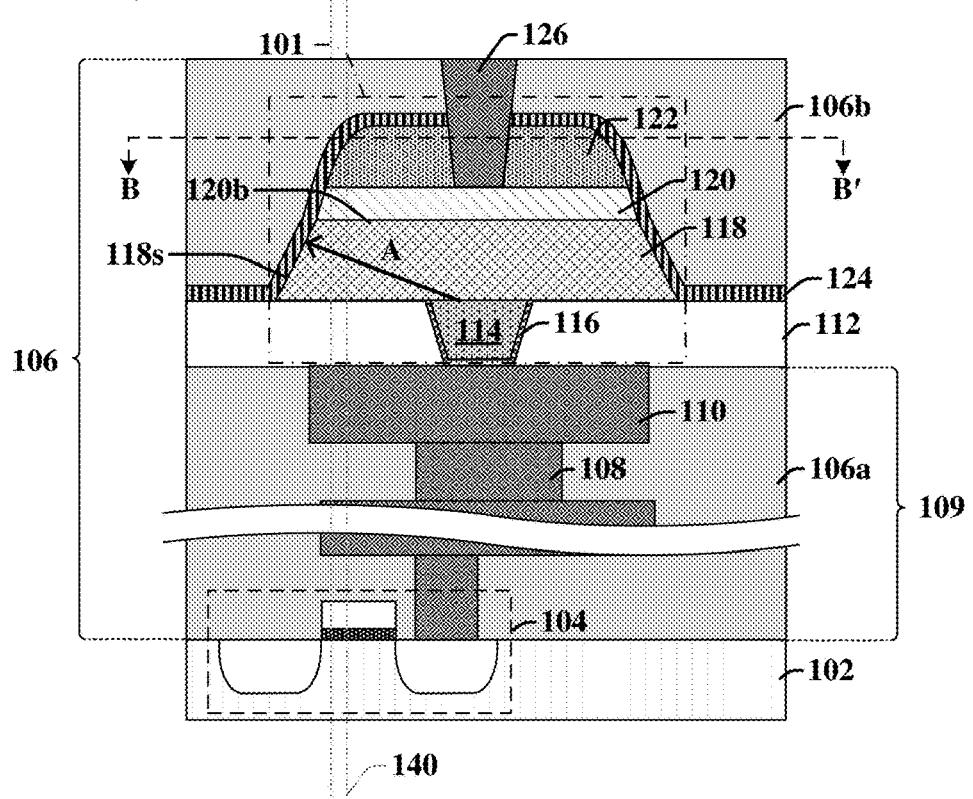
FIGS. 1A-1C illustrate some embodiments of an integrated chip having a phase-change random-access memory (PCRAM) device comprising a trapezoidal structure and a polymeric coating.
Figure 1A:
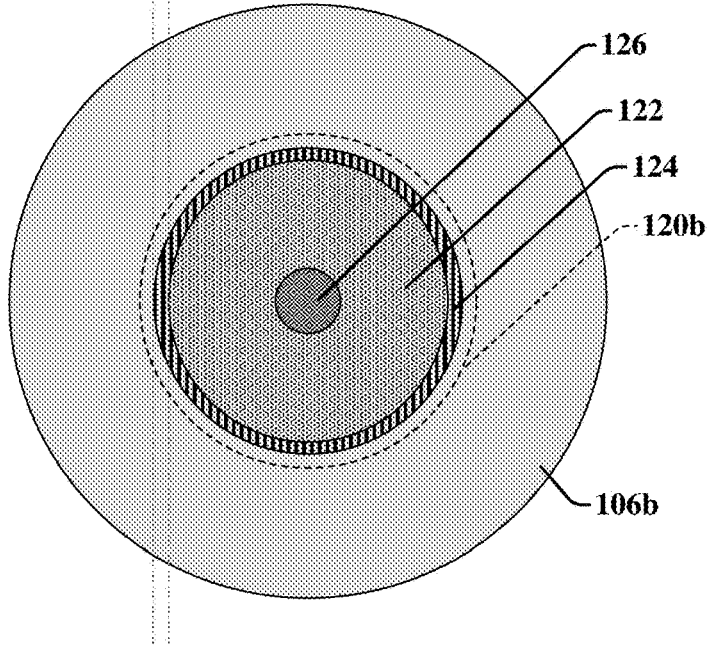

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase-change random-access memory (PCRAM) device includes a phase change material (PCM) layer arranged between top and bottom electrodes. The PCM layer comprises a structure that changes phase based on, for example, temperature change sequences. The phases may be substantially crystalline, amorphous, or somewhere in between. For example, when heated to very high temperatures the PCM layer has an amorphous structure, which is maintained upon quick cooling. When heated to intermediate temperatures, the PCM layer may form a crystalline structure, which is maintained upon cooling. Heating of the PCM layer may be conducted through joule heating. Joule heating involves the heat that is produced during the flow of an electric current through a conductive material. As current flows through the bottom electrode that is susceptible to joule heating, the temperature of the PCM layer is increased. As the PCM layer changes phase from crystalline to amorphous, for example, due to heating and cooling sequences, the resistance of the PCM layer changes from low to high, respectively. The high or low resistance of the PCM layer corresponds to bit values for data storage.

A PCRAM device may be manufactured by forming a PCM layer over a bottom electrode. A top electrode is subsequently formed over the PCM layer followed by formation of a hard mask over the top electrode. The hard mask and top electrode layer are patterned. Using the hard mask and top electrode as a mask, the PCM layer is then patterned, such that the hard mask, top electrode, and PCM layer have a substantially same width.

Oftentimes, the PCM layer is patterned using a dry etch, such as a halogen gas etch, which reacts with and damages sidewalls of the PCM layer. If the PCM layer has damaged sidewalls, the thermal dissipation path may become non-linear. The thermal dissipation path is the distance between the heat source (the bottom electrode) and the interface between sidewalls of the PCM layer and surrounding layers, such as an encapsulation layer or inter-layer dielectric (ILD) layers. Additionally, the sidewalls of the PCM layer are often substantially vertical, resulting in a long thermal dissipation path. Having a longer and non-linear thermal dissipation path reduces thermal confinement within the PCM layer. When the thermal confinement is poor, the time and/or current needed to change and maintain the phase of the PCM layer is increased, causing the switching speeds and/or power consumption, respectively, of the PCRAM device to increase. Increasing the switching speeds of the PCRAM device negatively impacts control of the PCRAM device.

In the present disclosure, a method of manufacturing and structure of PCRAM devices are presented to produce highly controllable PCRAM devices having fast switching speeds and low power consumption. The new manufacturing method utilizes an isotropic etch that is highly selective to the PCM layer and eliminates sidewall damage. Further, the isotropic etch results in a new structure of the PCRAM device comprising a PCM layer with a trapezoidal-like structure. Even further, the new method and structure may include a polymeric coating over outer sidewalls of the PCM layer, which is configured to confine heat within the PCM layer. The new method of manufacturing and corresponding PCRAM structure decreases the thermal dissipation path, suppresses heat dissipation and thus, increases thermal conferment within the PCM layer to provide a reliable PCRAM devices that have a low power consumption.

FIG. 1A illustrates a cross-sectional view 100A1 and corresponding top-view 100A2 of some embodiments of an integrated chip comprising a PCRAM cell.

The integrated chip in cross-sectional view 100A1 includes a PCRAM cell 101 arranged over a substrate 102. The PCRAM cell 101 comprises a phase change material (PCM) layer 118, which is separated from the substrate 102 by one or more lower interconnect layers 109 embedded within a lower portion 106a of a dielectric structure 106. The dielectric structure 106 often comprises one or more interlayer dielectric (ILD) layers. The one or more lower interconnect layers 109 comprise, in many embodiments, interconnect vias 108 and interconnect wires 110 configured to connect a bottom electrode 114 of the PCRAM cell 101 to a transistor 104 within the substrate 102.

The bottom electrode 114 may be embedded in an insulating layer 112 having one or more stacked dielectric materials. In some embodiments, the bottom electrode 114 is spaced apart from the insulating layer 112 by a barrier layer 116 (e.g., a diffusion barrier layer). The PCRAM cell 101 further comprises a PCM layer 118 disposed over the bottom electrode 114 and a top electrode 120 that is between the PCM layer and a hard mask 122.

A polymeric coating 124, in some embodiments, is disposed over the PCM layer 118, the top electrode 120, and the hard mask 122. The polymeric coating 124, in some embodiments, may also cover and contact top surfaces of the insulating layer 112. Thus, the polymeric coating 124 separates the PCM layer 118 from an upper portion 106b of the dielectric structure 106. The polymeric coating 124 may have a uniform thickness throughout its length due to a bias-free deposition process. The polymeric coating 124 may comprise a material that has a thermal conductivity that is lower than a thermal conductivity of the PCM layer 118 to suppress heat dissipation and promote thermal confinement within the PCM layer 118. By promoting thermal confinement, less joule heating is needed to write data to the PCRAM cell 101, thereby allowing for the PCRAM cell 101 to have a low power consumption. In many embodiments, a via 126 extends through the upper portion 106b of the dielectric structure 106, a top portion of the polymeric coating 124, and a top portion of the hard mask 122 to directly contact a top surface of the top electrode 120.

In many embodiments, the PCM layer 118 has a trapezoidal-like shape, where a top surface of the PCM layer 118 is narrower than a bottom surface of the PCM layer 118. The top and bottom surfaces of the PCM layer 118 may be connected by outer sidewalls 118s that are angled. Additionally, the top electrode 120 and the hard mask 122 may exhibit similar trapezoidal-like shapes due to residual effects of etching the PCM layer 118. In many embodiments, sidewalls of the hard mask 122 meet a top surface of the hard mask 122 at rounded corners because of its direct exposure to etching. In some embodiments, a bottom surface of the top electrode 120 may be equal in size to the top surface of the PCM layer 118. In other embodiments (not shown), the top surface of the PCM layer 118 may be wider than the bottom surface of the top electrode 120. The trapezoidal-like shaped PCM layer 118 reduces the thermal dissipation path, which is the distance between the bottom electrode 114 and outer sidewalls of the PCM layer 118. An example of one of many thermal dissipation paths is illustrated by arrow A. By reducing the thermal dissipation path and increasing thermal confinement in the PCRAM device, the RESET current of the PCRAM device is decreased, further decreasing power consumption of the PCRAM cell 101.

The top-view 100A2 is illustrated from cross-sectional line BB' of the cross-sectional view 100A1. Lines 140 illustrate corresponding boundaries of the polymeric coating 124 between the cross-sectional view 100A1 and the top-view 100A2.

As shown, lower portions of the via 126 are surrounded by the hard mask 122. Further, the polymeric coating 124 surrounds the hard mask 122. In some embodiments, the hard mask 122 and the polymeric coating 124 may have circular shapes. In other embodiments (not shown), the hard mask 122 and the polymeric coating 124 may have different shapes (e.g., rectangular, square, etc.). Although the top electrode 120 would not be visible in the top-view 100A2 because of the upper portion 106b of the dielectric structure 106, a projected bottom surface 120b of the top electrode 120 is illustrated. In some embodiments, the projected bottom surface 120b of the top electrode 120 has a diameter that is greater than the hard mask 122 diameter due to the trapezoidal-like shaped top electrode 120. In such embodiments, the polymeric coating 124 may have sidewalls that are located directly over the projected bottom surface 120b of the top electrode 120. In some additional embodiments (not shown), the polymeric coating 124 may have sidewalls that are located directly over a top surface of the top electrode 120.

Figure 1B:
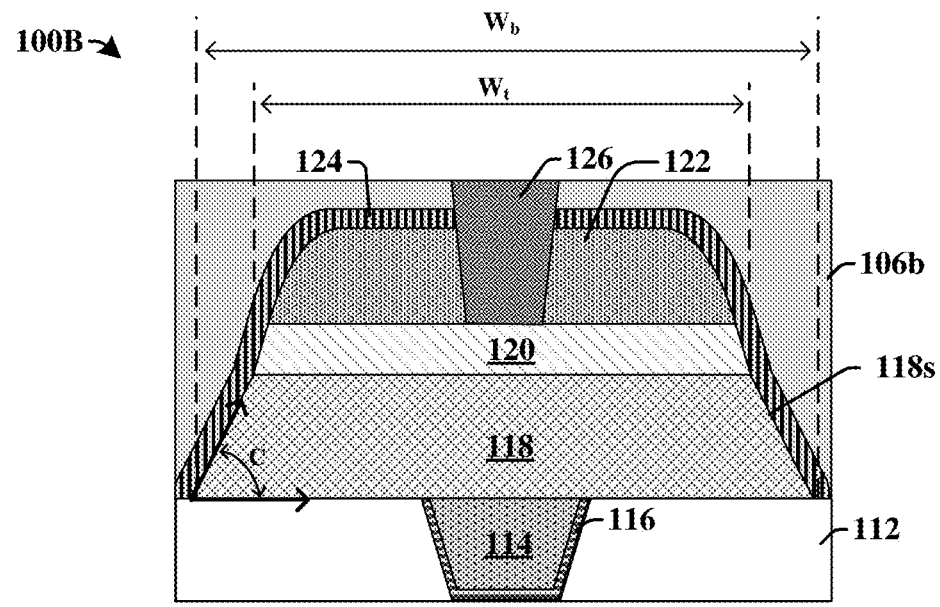

FIG. 1B illustrates a zoomed-in cross-sectional view 100B of the PCRAM cell 101 of FIG. 1A.

In many embodiments, the PCM layer 118 comprises a chalcogenide material, which is an alloy comprising an element of the VI group, combined with elements in the IV and/or V groups. The PCM layer 118 may comprise, for example, $Ge_2Sb_2Te_5$ (GST), ScSbTe, GeTe, InSb, $Sb_2Te_3$, $Sb_{70}Te_{30}$, GaSb, InSbTe, GaSeTe, $SnSbTe_4$, InSbGe, AgInSbTe, $Te_{81}Ge_{15}Sb_2S_2$, GeSbTe, SnSbTe, GeSbSe, GeSbTe, or the like. In many embodiments, the bottom and top surfaces of the PCM layer 118 is substantially planar. The bottom surface of the PCM layer 118 meets the outer sidewalls 118s of the PCM layer 118 at an angle C. To achieve sufficient thermal confinement to decrease power consumption, the angle C may be an acute angle. For example, in some embodiments, to achieve sufficient thermal confinement to decrease power consumption the angle C may be in a range of between approximately 45 degrees to approximately 75 degrees. In some additional embodiments, to achieve sufficient thermal confinement to decrease power consumption the angle C may be in a range of between approximately 45 degrees and approximately 60 degrees. In some embodiments, the outer sidewalls 118s of the PCM layer 118 are substantially linear from a cross-sectional view, as in cross-sectional view 100B.

In some embodiments, a maximum width of the bottom surface $W_b$ of the PCM layer 118 may be in a range of between approximately 100 nanometers and approximately 200 nanometers, and a maximum width of the top surface $W_t$ of the PCM layer 118 may be in a range of between approximately 40 nanometers and approximately 100 nanometers. In addition, the height of the PCM layer 118 may be in a range of between approximately 20 nanometers and approximately 40 nanometers, in some embodiments. To achieve sufficient thermal confinement to decrease power consumption, the ratio of the maximum width of the bottom surface $W_b$ to the maximum width of the top surface $W_t$ may be in a range of between approximately 0.2 and approximately 0.5. In some embodiments, the power consumption is decreased due to a RESET current reduction of up to approximately 20%. In some of embodiments, the RESET current may be in a range of between approximately 0.73 milliamps and approximately 0.80 milliamps.

The polymeric coating 124, in many embodiments is a carbon-like material that has a lower thermal conductivity than the material of the PCM layer 118. In some embodiments, the polymeric coating 124 comprises carbon and hydrogen. For example, the polymeric coating may be a $CH_x$ polymer, wherein x is between 2 and 4. In some embodiments, the thickness of the polymeric coating 124 may be in a range of between approximately 10 angstroms and approximately 15 angstroms.

Further, in some embodiments (not shown), the PCRAM cell 101 may be inverted, such that the maximum width of the top surface $W_t$ of the PCM layer 118 is larger than the maximum width of the bottom surface $W_b$ of the PCM layer 118. When the PCRAM cell 101 is inverted, the bias applied to top electrode 120 and the bottom electrode 114 is also inverted to effectively heat the PCM layer 118.

Figure 1C:
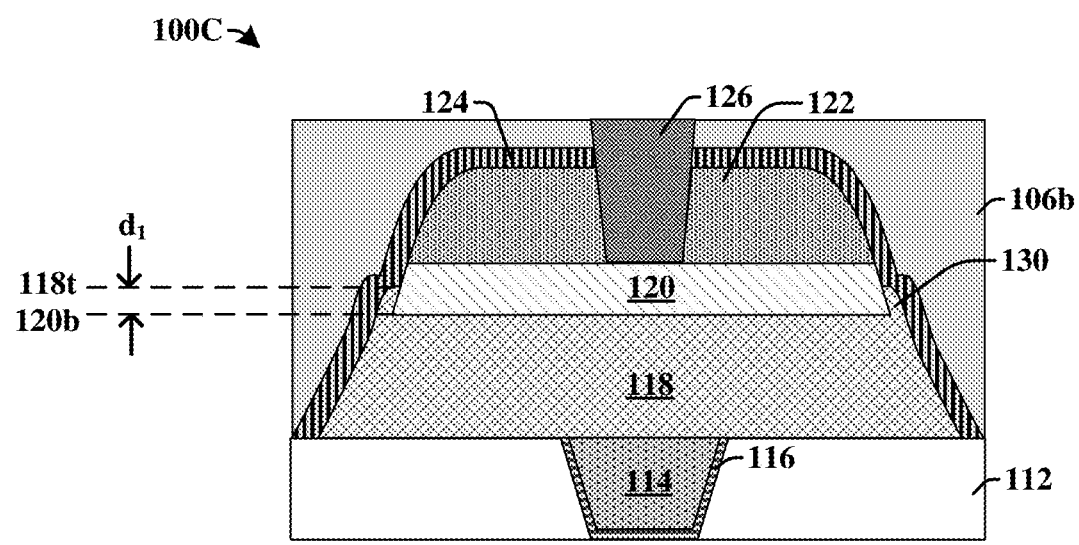

FIG. 1C illustrates a cross-sectional view 100C of an additional embodiment of the PCRAM cell 101 of FIG. 1A.

FIG. 1C comprises the same features as the cross-sectional view 100B of FIG. 1B in addition to an upper peripheral portion 130 of the PCM layer 118. The upper peripheral portion 130 may be included in some embodiments because of a redeposition effect in etching of the PCM layer 118. The upper peripheral portion 130 extends above an interface of where the top electrode 120 contacts the PCM layer 118. In some embodiments, where the PCM layer 118 includes the upper peripheral portion 130, a topmost surface 118t of the PCM layer 118 is above a bottommost surface 120b of the top electrode 120 by a distance $d_1$. In some embodiments, the distance $d_1$ may be smaller than the height of the top electrode 120. In other embodiments (not shown), the distance $d_1$ may be larger than the height of the top electrode 120. The top electrode 120, in some embodiments, may have a height in a range of between approximately 100 angstroms and approximately 300 angstroms.

Figure 2A:
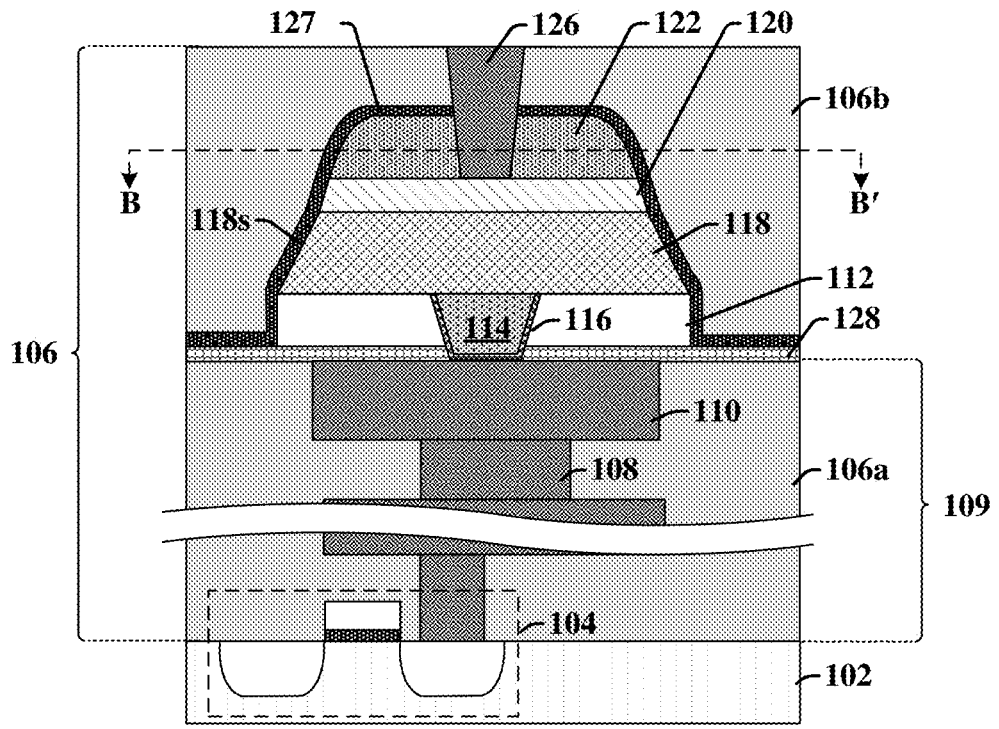
FIGS. 2A-2B illustrate some embodiments of an integrated chip having a PCRAM device comprising a trapezoidal structure.

FIG. 2A illustrates a cross-sectional view 200A of an additional embodiment of an integrated chip comprising a PCRAM cell.

FIG. 2A comprises similar features as FIG. 1A, except FIG. 2A does not include a polymeric coating (124 of FIG. 1A). In addition, the embodiment in cross-sectional view 200A includes an etch stop layer 128 between the insulating layer 112 and the interconnect wire 110. The etch stop layer 128 separates the lower portion 106a of the dielectric structure 106 from the upper portion 106b of the dielectric structure 106. The bottom electrode 114 and the barrier layer 116 extend through the etch stop layer 128 such that the bottom electrode 114 is coupled to the interconnect wire 110. In addition, in some embodiments, the insulating layer 112 has a substantially same width as the bottom surface of the PCM layer 118. In other embodiments, the insulating layer 112 may extend past opposing sides of the PCM layer 118. Like the PCM layer 118 in cross-sectional view 100A1 of FIG. 1A, the PCM layer 118 in cross-sectional view 200A has a trapezoidal shape to suppress heat dissipation by having a relatively short thermal dissipation path (e.g., a thermal dissipation path that is shorter than that of a PCM layer having a rectangular cross-sectional shape).

Further, at the boundary between outer sidewalls 118s of the PCM layer 118 and surrounding layers, a lattice mismatch may be present. In some embodiments, the surrounding layers may be the dielectric structure 106, whereas in other embodiments, the surrounding layers may be an encapsulation layer 127. In some embodiments, the encapsulation layer 127 may separate the dielectric structure 106 from the PCM layer 118. The encapsulation layer 127 may comprise silicon nitride, silicon oxide, or the like. The dielectric structure 106 may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the encapsulation layer 127 and the dielectric structure 106 comprise the same materials, whereas in other embodiments, the encapsulation layer 127 and the dielectric structure 106 comprise different materials. The lattice mismatch between the PCM layer 118 the encapsulation layer 127 may be due to the etch used during patterning of the PCM layer 118, in some embodiments. The lattice mismatch suppresses heat dissipation through phonon transport, promoting thermal confinement within the PCM layer 118, thereby decreasing power consumption of the PCRAM cell.

Figure 2B:
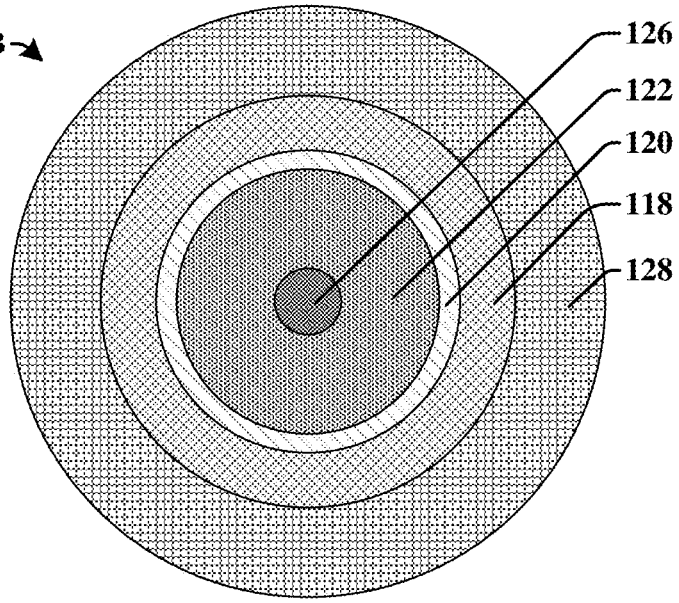

FIG. 2B illustrates a top-view 200B along line BB' of FIG. 2A of some embodiments of an integrated chip comprising a PCRAM cell.

The top-view 200B does not include the dielectric structure 106 or the encapsulation layer 127 of FIG. 2A. As shown, lower portions of the via 126 are surrounded by the hard mask 122. Further, from the top-view 200B, when the dielectric structure 106 is ignored, the top electrode 120 and the PCM layer 118 are visible because of their trapezoidal-like shapes.

FIGS. 3-15 illustrate cross-sectional views 300-1500 of some embodiments of a method of forming an integrated chip having a PCRAM cell. Although FIGS. 3-15 are described in relation to a method, it will be appreciated that the structures disclosed in FIGS. 3-15 are not limited to such a method, but instead may stand alone as structures independent of the method.

Figure 3:
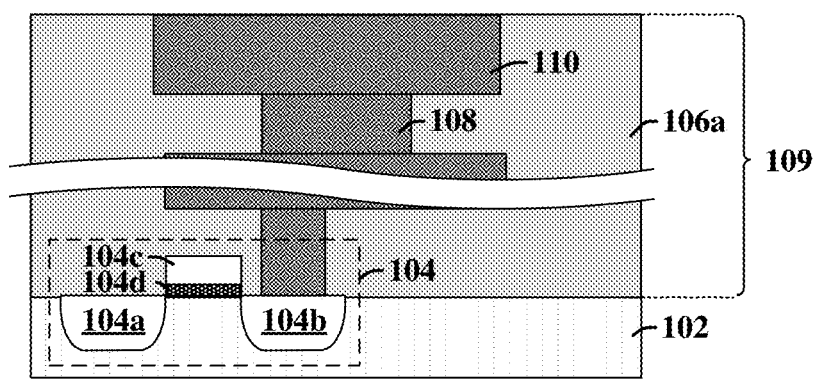
FIGS. 3-15 illustrate cross-sectional views of some embodiments of a method of forming an integrated chip having a PCRAM device comprising a trapezoidal structure and a polymeric coating.

As shown in cross-sectional view 300 of FIG. 3, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

A transistor 104 is formed within the substrate 102, comprising doped source/drain regions 104a/b between a conductive gate 104c that is over the substrate 102. A gate oxide layer 104d is arranged between the substrate 102 and the conductive gate 104c. One or more lower interconnect layers 109 comprising interconnect vias 108 and interconnect wires 110 are then formed over the transistor 104 and within a lower portion 106a of a dielectric structure. The interconnect vias 108 and interconnect wires 110 oftentimes comprise a conductive metal such as tungsten, copper, or the like. The one or more lower interconnect layers 109 are often formed using a damascene process (e.g., a single damascene process or a dual damascene process). The one or more lower interconnect layers 109 are coupled to one of the source/drain regions 104a/b.

Figure 4:
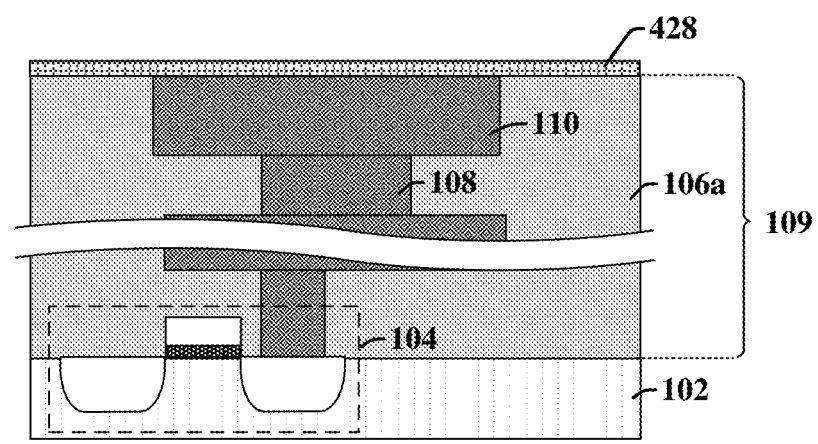

As shown in cross-sectional view 400 of FIG. 4, in some embodiments, an etch stop material 428 is deposited over the interconnect wire 110 and the lower portion 106a of the dielectric structure. The etch stop material 428 may be deposited by a vapor deposition technique (e.g., PVD, CVD, PE-CVD, ALD, etc.). In some embodiments, the etch stop material 428 may comprise a nitride (e.g., silicon nitride), a carbide (e.g., silicon carbide), or the like. The etch stop material 428, in some embodiments, may have a height in a range of between approximately 10 nanometers and approximately 30 nanometers.

Figure 5:
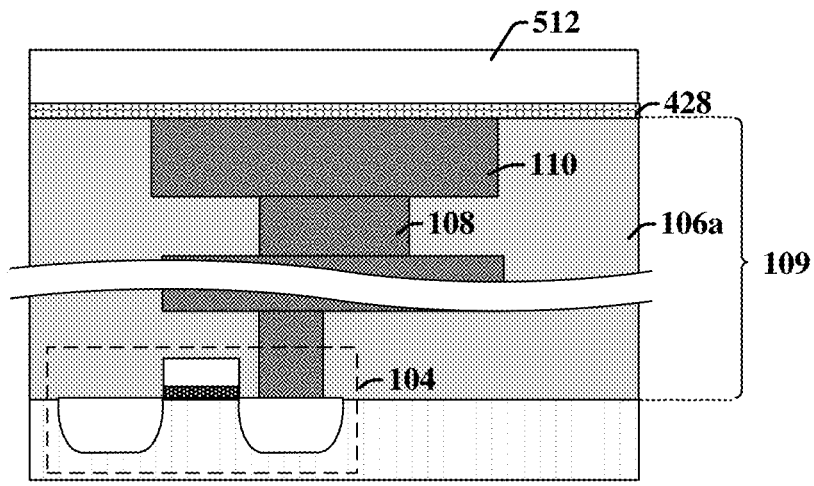

As shown in cross-sectional view 500 of FIG. 5, an insulating material 512 is deposited over the etch stop material 428. The insulating material 512 may be deposited by a vapor deposition technique (e.g., PVD, CVD, PE-CVD, ALD, etc). In some embodiments, the insulating material 512 comprises the same material as the lower portion 106a of the dielectric structure. In other embodiments, the insulating material 512 may be a silicon rich oxide, whereas the lower portion 106a of the dielectric structure comprises a different dielectric material such as, for example, nitride (e.g., silicon nitride), a carbide (e.g., silicon carbide), or the like. The insulating material 512, in some embodiments, may have a height in a range of between approximately 30 nanometers and approximately 60 nanometers.

Figure 6:
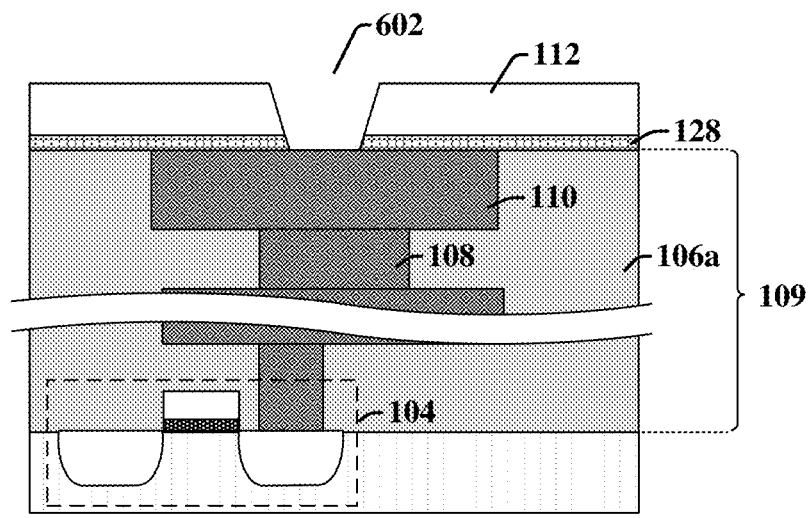

As shown in cross-sectional view 600 of FIG. 6, the insulating material (512 of FIG. 5) and the etch stop material (428 of FIG. 5) are patterned through photolithography and etching to form an opening 602 in an insulating layer 112 and an etch stop layer 128. The opening 602 extends through the etch stop layer 128 to expose a portion of the interconnect wire 110. In some embodiments, the opening 602 may be at least 40 nanometers wide. The opening 602 may also have tapered sidewalls due to residual etching effects.

Figure 7:
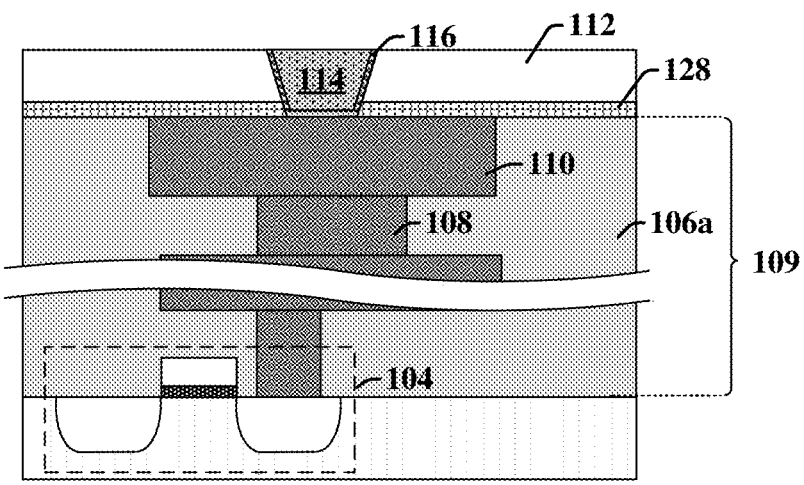

As shown in cross-sectional view 700 of FIG. 7, a bottom electrode 114 is formed within the opening (602 of FIG. 6) in the insulating layer 112. The bottom electrode 114 comprises a conductive material that is capable of joule heating. The bottom electrode 114 may comprise copper, titanium nitride, tantalum nitride, or the like. The bottom electrode 114 may be surrounded by a barrier layer 116 to prevent diffusion into the insulating layer 112. The barrier layer 116 may comprise tantalum, tantalum nitride, or titanium nitride, for example. In many embodiments, the bottom electrode 114 is deposited over the insulating layer 112 to fill the opening 602. The bottom electrode 114 may be formed using a deposition process and/or a plating process (e.g., electroplating, electro-less plating, etc.). Then, a planarization process (e.g., a chemical mechanical planarization process) may be conducted to remove excess material of the bottom electrode 114 such that an upper surface of the bottom electrode 114 is substantially planar and such that upper surfaces of the insulating layer 112 are uncovered.

Figure 8:
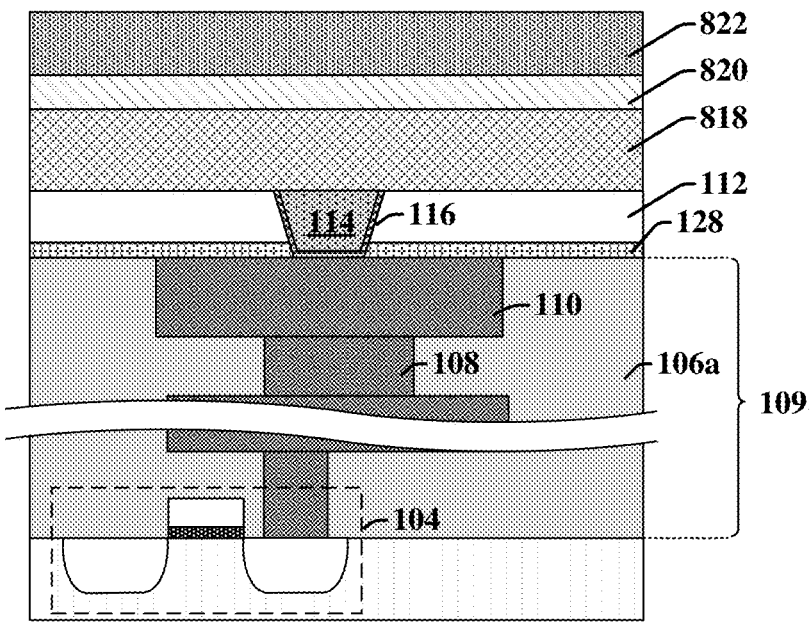

As shown in cross-sectional view 800 of FIG. 8, a deposited phase change material (PCM) layer 818, a top electrode layer 820, and a hard mask layer 822 are sequentially deposited over the bottom electrode 114 and the insulating layer 112. Thus, the deposited PCM layer 818 separates the top electrode layer 820 from the bottom electrode 114. The deposited PCM layer 818 may be deposited by physical vapor deposition (PVD) or sputtering. In some embodiments, the deposited PCM layer 818 may have a height in a range of between approximately 250 angstroms and approximately 350 angstroms. The top electrode layer 820 comprises a conductive material, such as copper, aluminum copper, titanium nitride, tantalum nitride, or the like. In some embodiments, the top electrode layer 820 may have a height in a range of between approximately 150 angstroms and approximately 200 angstroms. The hard mask layer 822 is deposited over the top electrode layer 820. The hard mask layer 822 may comprise silicon, an oxide, silicon nitride, silicon oxynitride, silicon carbide, or the like. In some embodiments, the hard mask layer 822 may have a height in a range of between approximately 350 angstroms and approximately 400 angstroms.

Figure 9:
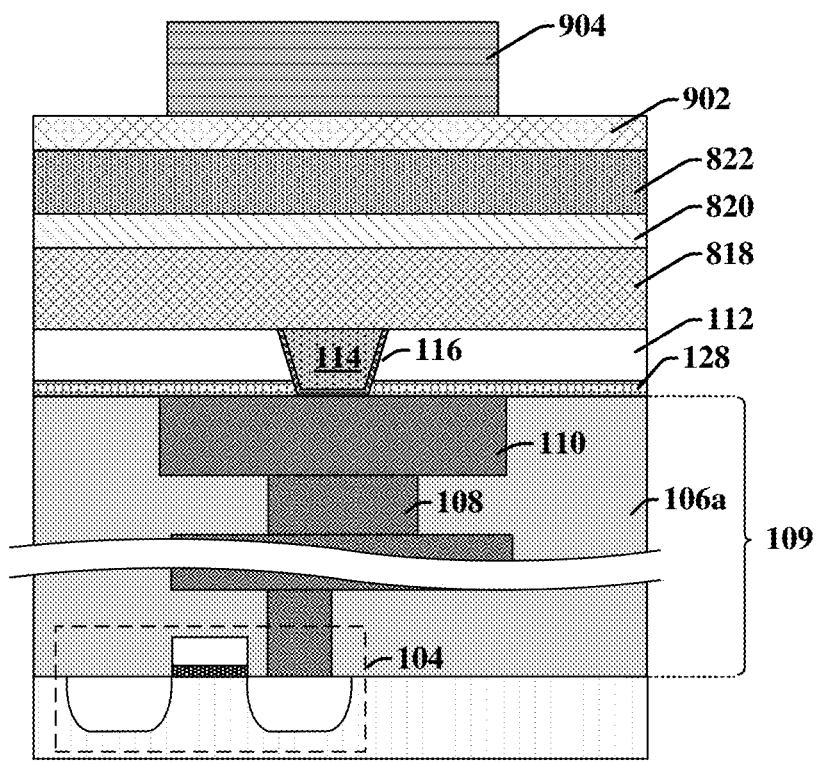

As shown in cross-sectional view 900 of FIG. 9, an organic mask 902 and an overlying photoresist 904 are deposited over the hard mask layer 822. In many embodiments, the photoresist 904 and the organic mask 902 are deposited using a spin coating process, a deposition process, or the like. The organic mask 902 may be a bottom anti-reflective coating (BARC), an anti-reflective coating (ARC), a bottom photoresist coating layer, or the like. The photoresist 904 comprises a photosensitive material. Using photolithography, the photoresist 904 is patterned to cover center portions of the hard mask layer 822 and the top electrode layer 820. The photoresist 904 is directly over the bottom electrode 114 after patterning, as illustrated in cross-sectional view 900. In many embodiments, the photoresist 904 is patterned to be wider than the bottom electrode 114. Thus, the photoresist 904 has a width greater than 40 nanometers in most embodiments. In some embodiments, the organic mask 902 may have a height in a range of between approximately 250 angstroms and approximately 450 angstroms, and the photoresist 904 may have a height in a range of between approximately 1200 angstroms and approximately 1300 angstroms.

Figure 10:
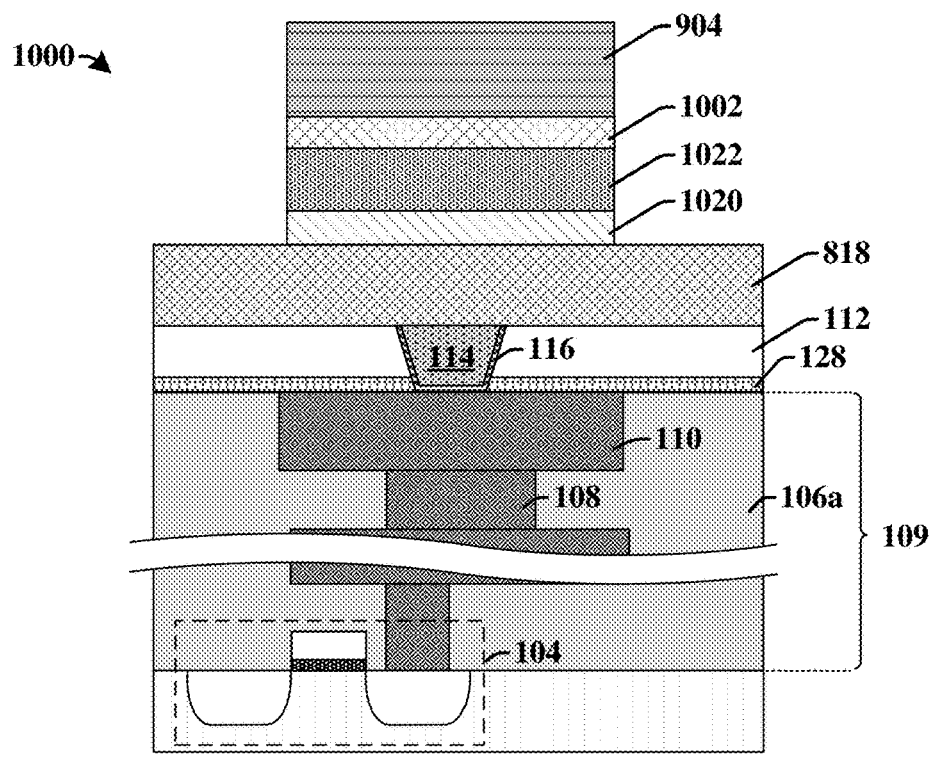

As shown in cross-sectional view 1000 of FIG. 10, an etch process comprising three steps is conducted on the organic mask (902 of FIG. 9) according to the photoresist 904, the top electrode layer (820 of FIG. 9), and the hard mask layer (822 of FIG. 9) to respectively form a patterned organic mask 1002, followed by a patterned hard mask 1022, followed by a patterned top electrode 1020. The etch process is performed within a processing chamber and may use a plasma etchant. In some embodiments, the plasma etchant may be formed as a transformer coupled plasma (TCP) by a TCP source. In other embodiments, the plasma etchant may be formed as a capacitively coupled plasma (CCP), an inductively coupled plasma (ICP), or the like.

The first step in the etch process targets the organic mask (902 of FIG. 9) to form the patterned organic mask 1002 according to the photoresist 904. In some embodiments, the first step of the etch process is conducted within the processing chamber at a pressure in a range of between approximately 1 millitorr and approximately 100 millitorr. In some embodiments, the first step of the etch process may use a plasma etchant that is formed by a TCP source at a power in a range of between approximately 200 watts and approximately 800 watts. In some embodiments, a bias voltage is applied to a wafer chuck (not shown) configured to hold the substrate 102. In many embodiments, the bias voltage used is in a range of approximately 100 volts and approximately 500 volts. In various embodiments, the etching gas used in the first step of the etch process may comprise the following: oxygen gas having a flow in a range of between approximately 1 standard cubic centimeter per minute and approximately 20 standard cubic centimeters per minute; chlorine gas having a flow in a range of between approximately 5 standard cubic centimeters per minute and approximately 50 standard cubic centimeters per minute; helium gas having a flow in a range of between approximately 100 standard cubic centimeters per minute and approximately 300 standard cubic centimeters per minute; and/or $CH_2F_2$ gas having a flow in a range of between approximately 10 standard cubic centimeters per minute and approximately 100 standard cubic centimeters per minute.

The second step in the etch process targets the hard mask layer (822 of FIG. 9) to form the patterned hard mask 1022 according to the photoresist 904. In some embodiments, the second step of the etch process is conducted at a pressure in a range of between approximately 1 millitorr and approximately 100 millitorr. In some embodiments, the TCP source power is set to a power in a range of between approximately 200 watts and approximately 1000 watts. In some embodiments, a bias voltage is set to a voltage in a range of approximately 100 volts and approximately 700 volts. In various embodiments, the etching gas used in the second step of the etch process may comprise the following: $SF_6$ having a flow in a range of between approximately 10 standard cubic centimeters per minute and approximately 80 standard cubic centimeters per minute; $CF_4$ having a flow in a range of between approximately 10 standard cubic centimeters per minute and approximately 50 standard cubic centimeters per minute; helium gas having a flow in a range of between approximately 100 standard cubic centimeters per minute and approximately 300 standard cubic centimeters per minute; and/or $CH_2F_2$ gas having a flow in a range of between approximately 10 standard cubic centimeters per minute and approximately 100 standard cubic centimeters per minute.

The third and final step in the etch process targets the top electrode layer (820 of FIG. 9) to form the patterned top electrode 1020. In some embodiments, the third step of the etch process is conducted at a pressure in a range of between approximately 1 millitorr and approximately 100 millitorr. In some embodiments, the TCP source power is set to a power in power in a range of between approximately 200 watts and approximately 1000 watts. In some embodiments, a bias voltage is set to a voltage in a range of approximately 100 volts and approximately 900 volts. In various embodiments, the etching gas used in the third step of the etch process may comprise the following: chlorine gas having a flow in a range of between approximately 10 standard cubic centimeters per minute and approximately 200 standard cubic centimeters per minute; $CF_4$ having a flow in a range of between approximately 10 standard cubic centimeters per minute and approximately 100 standard cubic centimeters per minute; argon gas having a flow in a range of between approximately 50 standard cubic centimeters per minute and approximately 500 standard cubic centimeters per minute; and/or HBr gas having a flow in a range of between approximately 10 standard cubic centimeters per minute and approximately 100 standard cubic centimeters per minute.

Figure 11:
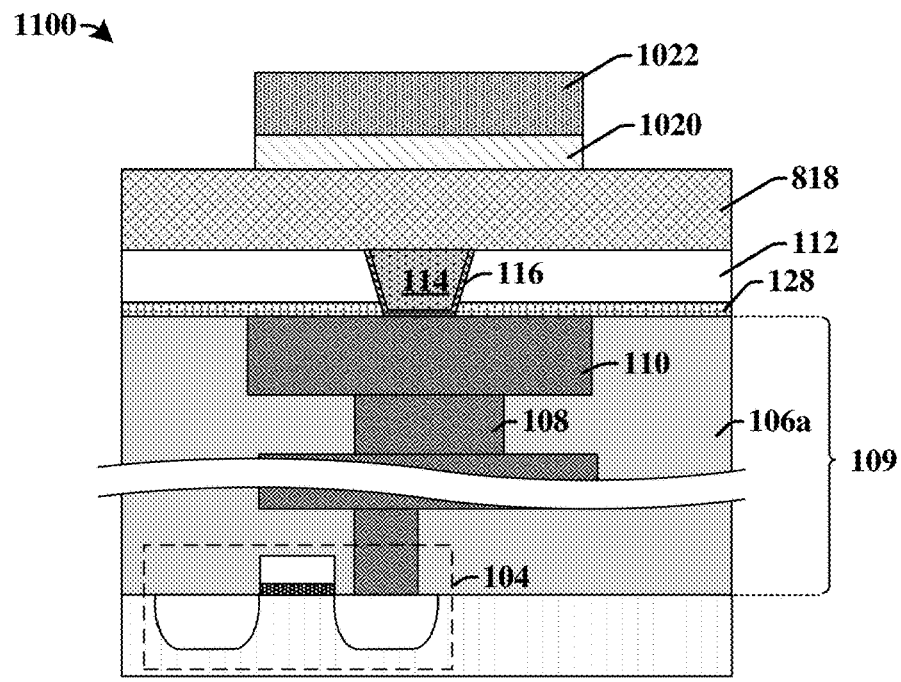

As shown in cross-sectional view 1100 of FIG. 11, the photoresist (904 of FIG. 10) and the patterned organic mask (1002 of FIG. 10) are stripped, leaving behind the patterned top electrode 1020 and the patterned hard mask 1022. The deposited PCM layer 818 is wider than the patterned top electrode 1020 and the patterned hard mask 1022.

Figure 12A:
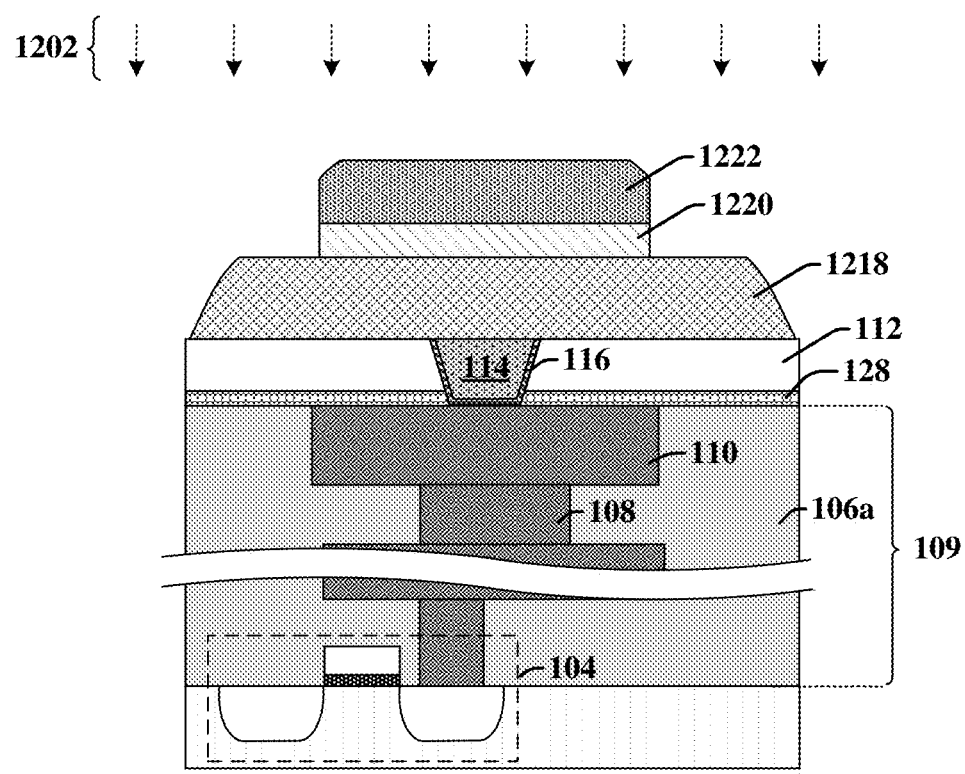

As shown in cross-sectional view 1200A of FIG. 12A, an isotropic etch 1202 is conducted on the deposited PCM layer (818 of FIG. 11). In some embodiments, the isotropic etch 1202 is conducted at pressures in a range of between approximately 1 millitorr and approximately 100 millitorr. In some embodiments, the TCP source power is set to a power in power in a range of between approximately 100 watts and approximately 800 watts. In some embodiments, a bias voltage is set to a voltage in a range of approximately 100 volts and approximately 800 volts. In various embodiments, the etching gas used in the isotropic etch 1202 may comprise the following: argon having a flow in a range of between approximately 50 standard cubic centimeters per minute and approximately 1000 standard cubic centimeters per minute; nitrogen having a flow in a range of between approximately 20 standard cubic centimeters per minute and approximately 5000 standard cubic centimeters per minute; and/or helium having a flow in a range of between approximately 100 standard cubic centimeters per minute and approximately 2000 standard cubic centimeters per minute.

The isotropic etch 1202 undergoes a series of cycles or pulses to vary a pressure within the processing chamber between high and low. A single "cycle" includes a high pressure step followed by a low pressure step. The isotropic etch 1202 may undergo up to 10 cycles or more, in some embodiments. The number of cycles and the parameters of the isotropic etch 1202 is dependent based on the desired final shape of the deposited PCM layer 818 to achieve sufficient thermal confinement within the PCM layer 818 to decrease power consumption. The high pressure cycles include, for example, introducing pure argon gas in the processing chamber at a high pressure, up to approximately 100 millitorr. The high pressure cycles etch and remove material from the sidewall of the deposited PCM layer 818. The low pressure cycles utilize low pressure, as low as approximately 1 millitorr with, for example, a heavy argon ion bombardment. The low pressure cycles may result in the redeposition of the phase change material on the sidewalls of a PCRAM structure. This is because the phase change material is polymeric or polymer-like, and does not vaporize during etching. However, in many embodiments, the high pressure cycles etch the phase change material faster than the low pressure cycles redeposit the phase change material, so that there is substantially no deposition of the phase change material on the sidewalls. The low pressure step often utilizes a low enough pressure that, in many embodiments, effectively suppresses redeposition of the phase change material.

The cross-sectional view 1200A of FIG. 12A is an exemplary view of a PCRAM structure during an early time of the isotropic etch 1202. The cross-sectional view 1200A shows a preliminary PCM layer 1218, a preliminary top electrode 1220 and a preliminary hard mask 1222. The preliminary PCM layer 1218 has a bottom surface that is wider than a top surface. Outer sidewalls of the preliminary PCM layer 1218 are slanted and connect the bottom surface to the top surface. In some embodiments, the outer sidewalls of the preliminary PCM layer 1218 are non-linear from a cross-sectional view. In other embodiments, as in cross-sectional view 100B, the outer sidewalls of the preliminary PCM layer 1218 are substantially linear. The top surface of the preliminary PCM layer 1218 is substantially centered over the bottom surface of the preliminary PCM layer 1218. The preliminary hard mask 1222 has angled upper corners. In other embodiments, the preliminary hard mask 1222 may have rounded upper corners. In some embodiments, the preliminary hard mask 1222 is not substantially different from the patterned hard mask 1022 of FIG. 11.

In many embodiments, the isotropic etch 1202 may comprise argon gas and is highly selective to the deposited PCM layer 818. In other embodiments, a different noble gas may be used instead of argon. Noble gases are used because they do not react and damage the sidewalls of the deposited PCM layer 818. For example, in some embodiments, the ratio of selectivity between the patterned hard mask 1022 to the patterned top electrode 1020 to the deposited PCM layer 818 is approximately 1 to 2 to 5.

Figure 12B:
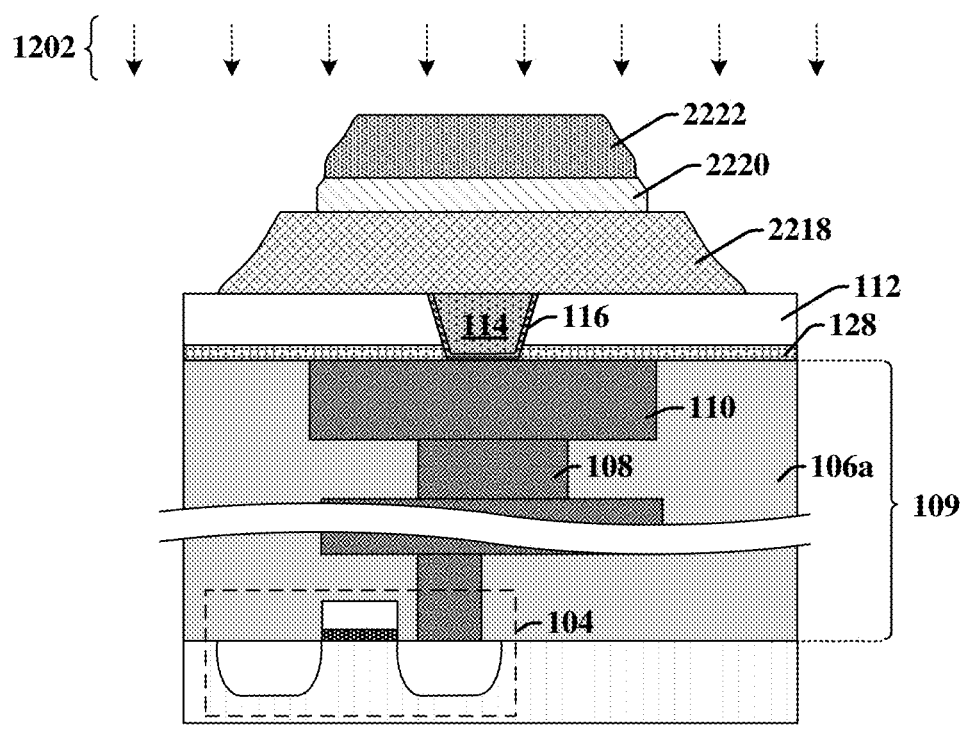

As shown in cross-sectional view 1200B of FIG. 12B, an exemplary embodiment resulting from the isotropic etch 1202 is shown during an intermediate time later than the cross-sectional view 1200A of FIG. 12A, but still while the isotropic etch 1202 is occurring. The width of the intermediate PCM layer 2218 has been reduced, and upper surfaces of the insulating layer 112 are exposed. The intermediate PCM layer 2218 may have outer sidewalls that are non-linear. The intermediate top electrode 2220 has slanted or rounded-like upper corners. Portions of the intermediate hard mask 2222 have been removed due to residual effects of the isotropic etch 1202, and the intermediate hard mask 2222 begins to exhibit more of a trapezoidal-like shape than the shape of the preliminary hard mask 1222. An upper surface of the intermediate PCM layer 2218 is wider than a bottom surface of the intermediate top electrode 2220.

Figure 12C:
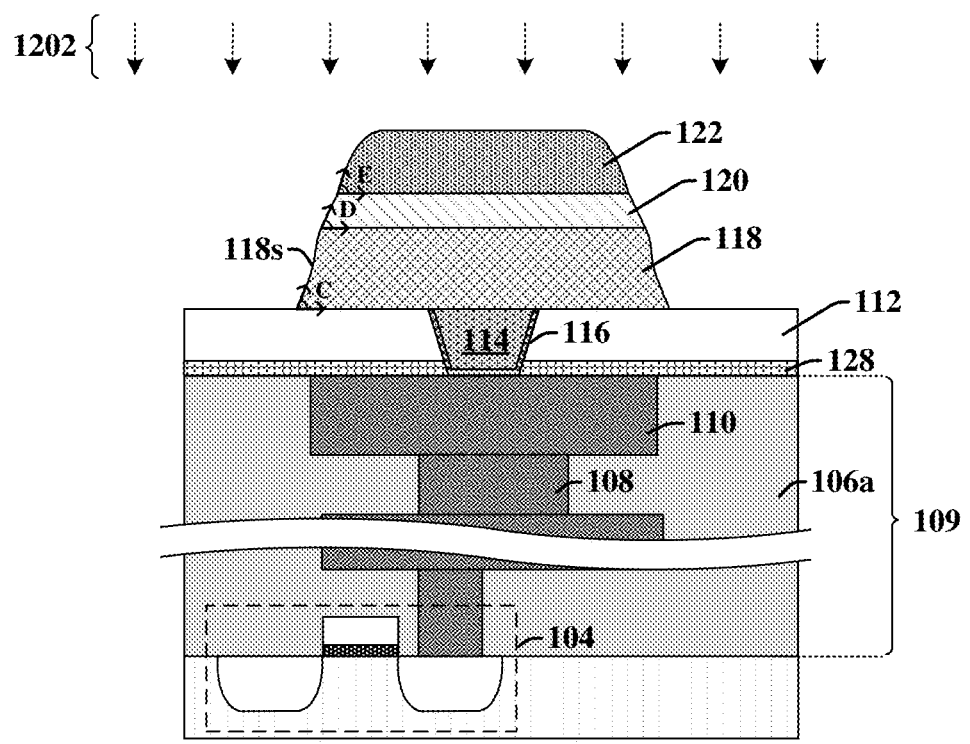

As shown in cross-sectional view 1200C of FIG. 12C, a PCM layer 118, a top electrode 120, and a hard mask 122 after the completion of the isotropic etch 1202 is shown for some embodiments. The PCM layer 118 typically has a trapezoidal-like shape as illustrated in FIG. 12C, and has a topmost surface that is substantially even with a bottommost surface of the top electrode 120. In some embodiments, the topmost surface of the PCM layer 118 is wider than the bottommost surface of the top electrode 120 after the isotropic etch 1202. The PCM layer 118 may have non-linear outer sidewalls 118s from a cross-sectional view, as in cross-sectional view 1200C. The bottom surface of the PCM layer 118 approximately meets the outer sidewalls 118s of the PCM layer 118 at an angle C. In various embodiments, the angle C may be in a range of between approximately 45 degrees and approximately 75 degrees. The top electrode 120 may have outer sidewalls that meet a bottom surface of the top electrode 120 at an angle D. The hard mask 122 may have outer sidewalls that meet a bottom surface of the hard mask 122 at an angle E. In some embodiments, angles C, D and E are substantially the same. In other embodiments, as in cross-sectional view 1200C, angles D and E may each be less than angle C.

Further, in some embodiments, the PCM layer 118 may have a substantially uniform lattice structure throughout the trapezoidal-like shape, without damage on its outermost sidewalls. In some embodiments, the PCM layer 118 may have an upper surface that is wider than the bottom surface of the top electrode 120. In yet other embodiments, the low pressure step of the isotropic etch 1202 redeposits the phase change material faster than the high pressure step of the isotropic etch 1202 etches the phase change material, resulting in a PCM layer 118 as shown in FIG. 1C with upper peripheral portions 130.

Figure 13A:
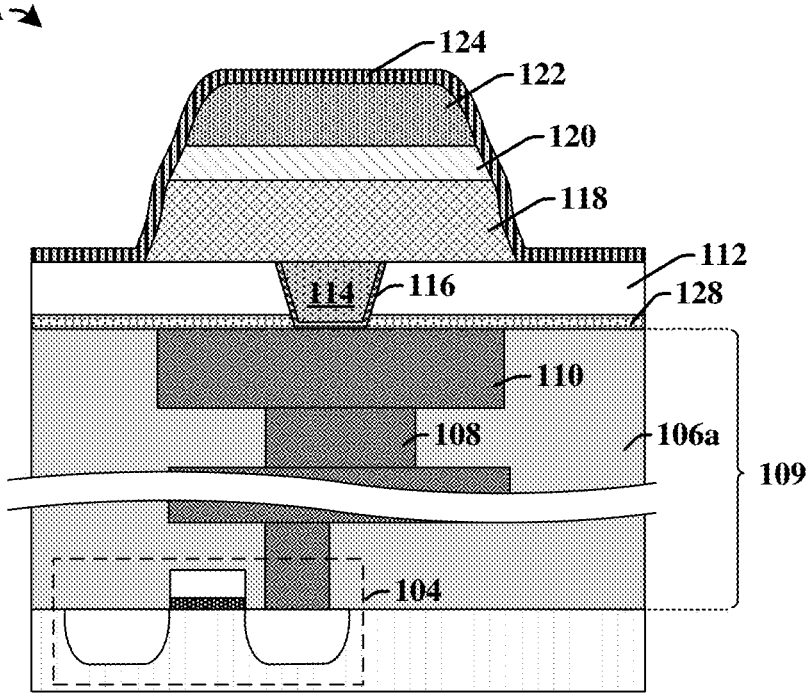

As shown in cross-sectional view 1300A of FIG. 13A, a polymeric coating 124 is deposited over the hard mask 122, the top electrode 120, and the PCM layer 118. The polymeric coating 124 may comprise a carbon-like material that has a lower thermal conductivity than the material of the PCM layer 118. Therefore, the polymeric coating 124 promotes thermal confinement within the PCM layer 118. For example, the polymeric coating 124 may be a $CH_x$ polymer, wherein x is between 2 and 4.

In some embodiments, the polymeric coating 124 is deposited in-situ with the isotropic etch 1202 using a $CH_4$, argon, and/or helium plasma. In some embodiments, the flow of the plasma may be in a range of between approximately 50 standard cubic centimeters per minute and approximately 500 standard cubic centimeters per minute. In some embodiments, the TCP source power may be in a range of between approximately 100 watts and approximately 800 watts. In some embodiments, a bias voltage is not used to allow the thickness of the polymeric coating 124 to be substantially equal throughout its length. The thickness of the polymeric coating 124 is, in some embodiments, in a range of between approximately 1 nanometer and approximately 3 nanometers.

Figure 13B:
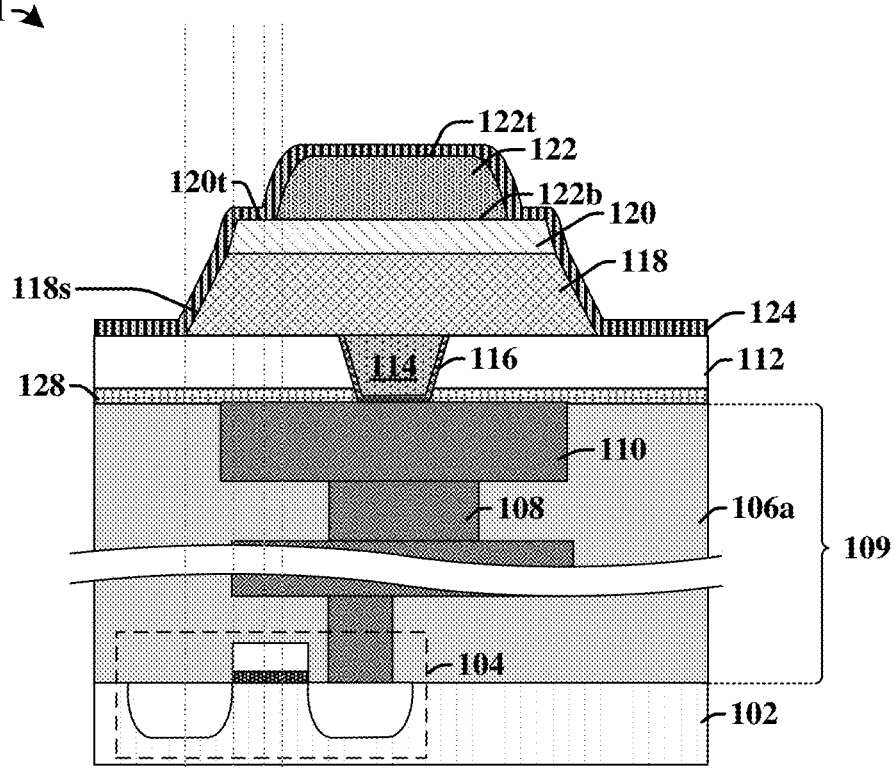
Figure 13B:
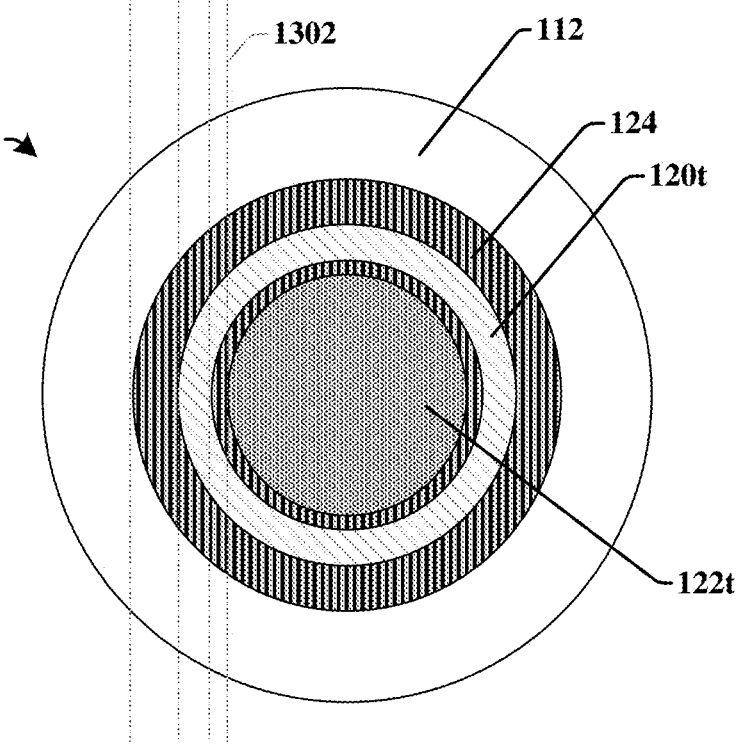

As shown in cross-sectional view 1300B1 of FIG. 13B, an alternative embodiment of cross-sectional view 1300A of FIG. 13A is shown, in which the hard mask 122 has a bottom surface 122b that is narrower than a top surface 120t of the top electrode 120. The cross-sectional view 1300B1 may be a result of the hard mask 122 having a faster removal rate than the top electrode 120 during the isotropic etch 1202 of FIGS. 12A-12C. Lines 1302 illustrate corresponding boundaries of the polymeric coating 124 between the cross-sectional view 1300B1 and a top-view 1300B2.

Top-view 1300B2 of FIG. 13B corresponds to an image taken using an imaging tool (e.g., SEM, TEM, or the like). As shown in the top-view 1300B2, portions of the polymeric coating 124 disposed over underlying horizontal surfaces may not be visible using the imaging tool due to its small thickness (between approximately 1 nanometer and approximately 3 nanometers), while portions of the polymeric coating 124 arranged along vertically extending surfaces may be visible. For example, in some embodiments, the polymeric coating 124 may appear as two rings in the top-view 1300B2 because the polymeric coating 124 along sidewalls of the hard mask 122, top electrode 120 and/or phase change material 118 may be thicker from the top-view 1300B2 perspective compared to the polymeric coating 124 on a top surface 122t of the hard mask 122 and on the top surface 120t of the top electrode 120. For example, the polymeric coating 124 on the top surface 120t of the top electrode 120 may be too thin to appear on the top-view 1300B2, in some embodiments. Thus, although covered by the polymeric coating 124 as seen in the cross-sectional view 1300B1, the top surface 120t of the top electrode 120 may be visible in the top-view 1300B2, between the two rings of the polymeric coating 124. Similarly, the top surface 122t of the hard mask 122 may be visible in the top-view 1300B2, although covered by the polymeric coating 124, because the polymeric coating 124 covering a top surface 122t of the hard mask 122 is too thin from the top-view 1300B2 perspective. For these same reasons, although covered by the polymeric coating 124, in some embodiments, the insulating layer 112 may be visible from the top-view 1300B2. In other embodiments, the polymeric coating 124 may appear as more than two rings from the top-view 1300B2 perspective.

Figure 14:
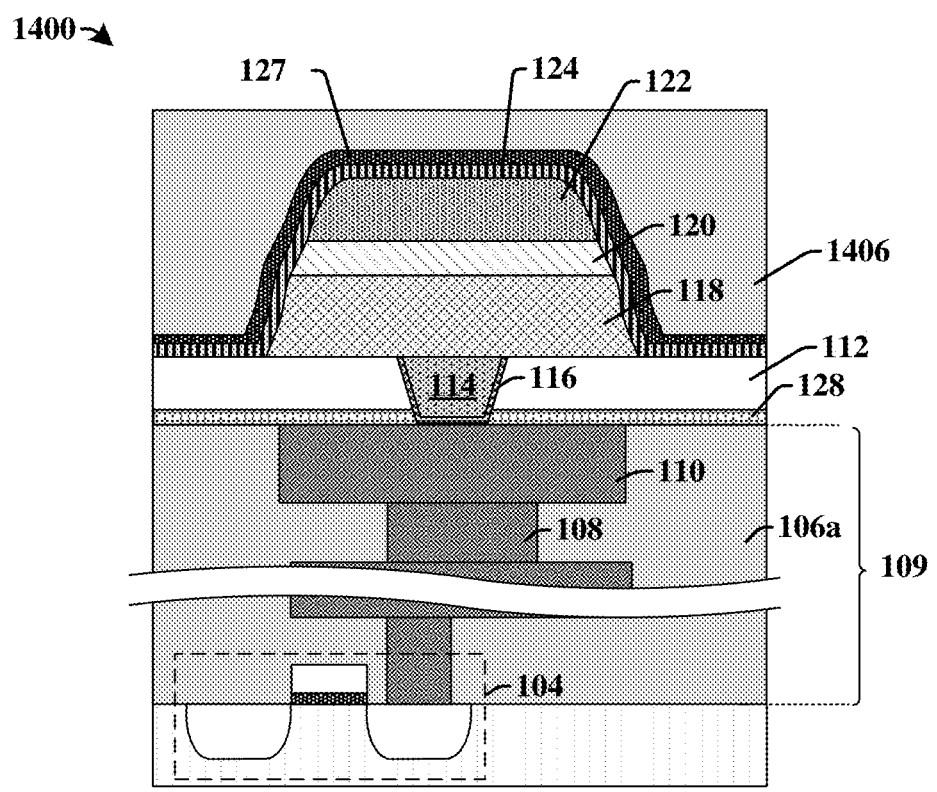

As shown in cross-sectional view 1400 of FIG. 14, an upper inter-layer dielectric (ILD) layer 1406 is disposed over the polymeric coating 124. In some embodiments, an encapsulation layer 127 is disposed over the polymeric coating 124 before the upper ILD layer 1406 is deposited, such that the encapsulation layer 127 separates the polymeric coating 124 from the upper ILD layer 1406. The encapsulation layer 127 may comprise silicon nitride, silicon oxide, or the like. In some embodiments, the upper ILD layer 1406 may be deposited by a physical vapor deposition technique (e.g., PVD, CVD, PE-CVD, ALD, etc.). The upper ILD layer 1406 may comprise the same material as the lower portion 106a of the dielectric structure such as, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 15:
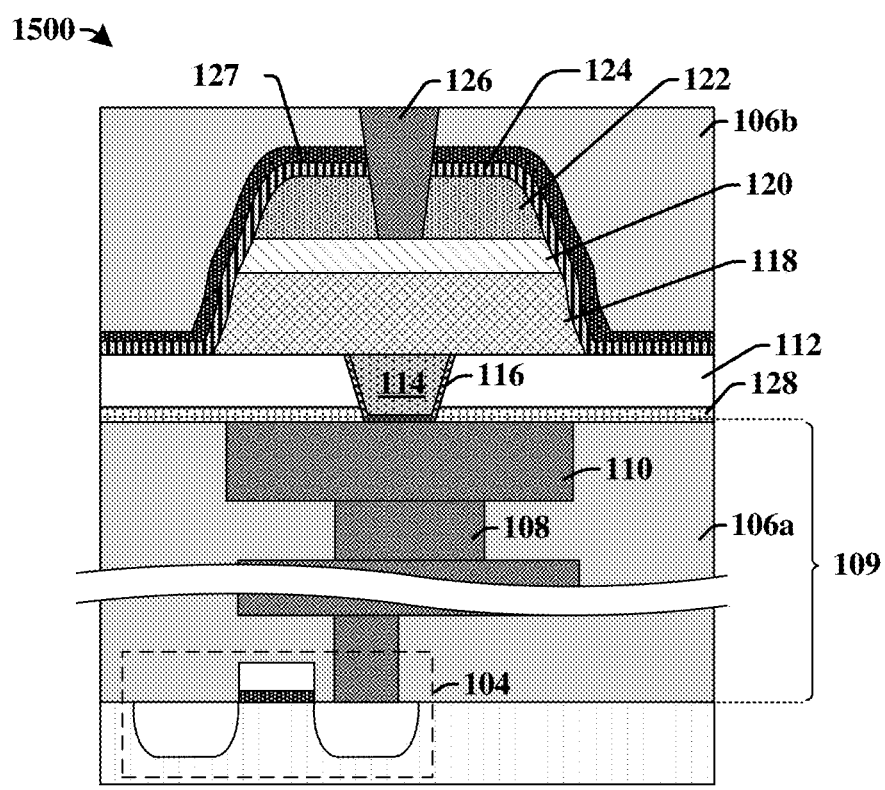

As shown in cross-sectional view 1500 of FIG. 15, the upper ILD layer (1406 of FIG. 14) is patterned to form an upper portion 106b of the dielectric structure. The upper portion 106b of the dielectric structure is patterned to form an opening for a via 126. Additionally, the encapsulation layer 127, the polymeric coating 124, and the hard mask 122 are patterned for the via 126, such that the via 126 is deposited over the upper portion 106b of the dielectric structure to contact the top electrode 120. The via 126 may be deposited using a deposition process and/or plating process (e.g., electroplating, electro-less plating, etc.). The via 126 may comprise a conductive metal such as, for example, copper, tungsten, or the like.

Figure 16:
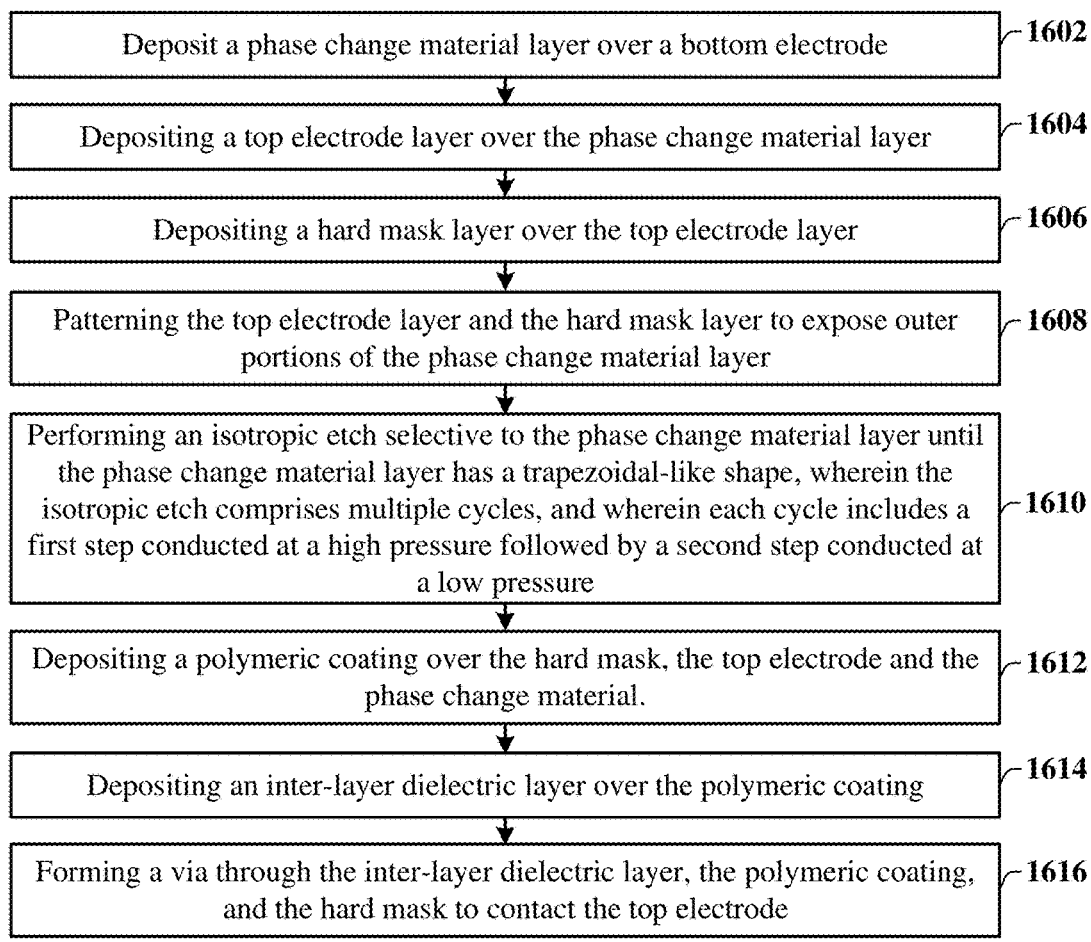
FIG. 16 illustrates a flow diagram of some embodiments of a method of forming an integrated chip having a PCRAM device comprising a trapezoidal structure and a polymeric coating.

FIG. 16 illustrates a flow diagram of some embodiments of a method 1600 of forming an integrated chip having a PCRAM device.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a phase change material (PCM) layer is deposited over a bottom electrode.

At 1604, a top electrode layer is deposited over the PCM layer.

At 1606, a hard mask layer is deposited over the top electrode layer. FIG. 8 illustrates a cross-sectional view 800 of some embodiments corresponding to acts 1602, 1604, and 1606.

At 1608, the top electrode and hard mask layers are patterned to expose outer portions of the PCM layer. FIG. 10 illustrates a cross-sectional view 1000 of some embodiments corresponding to act 1608.

At 1610, an isotropic etch, selective to the PCM layer, is performed. The isotropic etch comprises multiple cycles. Each cycle includes a first step at a high pressure followed by a second step at a low pressure. The isotropic etch is performed until the PCM has a trapezoidal-like shape. FIGS. 12A-C illustrate cross-sectional views 1200A-C of some embodiments corresponding to act 1610.

At 1612, a polymeric coating is deposited over the hard mask, top electrode and PCM. FIGS. 13A and 13B illustrate cross-sectional views 1300A and 1300B1 of various embodiments corresponding to act 1612.

At 1614, an inter-layer dielectric is deposited over the polymeric coating. FIG. 14 illustrates a cross-sectional view 1400 of some embodiments corresponding to act 1614.

At 1616, a via is formed through the inter-layer dielectric layer, the polymeric coating, and the hard mask to contact the top electrode. FIG. 15 illustrates a cross-sectional view 1500 of some embodiments corresponding to act 1616.

Therefore, the present disclosure relates to a method of manufacturing a PCRAM device that increases thermal confinement and suppresses heat dissipation within the PCM by decreasing the thermal dissipation path by forming a trapezoidal-like shaped PCM, and reducing the thermal conductivity at the PCM boundary with a polymeric coating. The method provides for a PCRAM cell having a low power consumption.

Accordingly, in some embodiments, the present disclosure relates to an integrated chip, comprising: a phase change material disposed over a bottom electrode and configured to change from a crystalline structure to an amorphous structure upon temperature changes; a top electrode disposed over an upper surface of the phase change material; a via electrically contacting a top surface of the top electrode; and wherein a maximum width of the upper surface of the phase change material is less than a maximum width of a bottom surface of the phase change material.

In other embodiments, the present disclosure relates to an integrated chip, comprising: a phase change material disposed over a bottom electrode and configured to change its structure between a substantially crystalline structure and a substantially amorphous structure upon temperature changes, wherein the phase change material has a topmost surface and a bottommost surface, and wherein a maximum width of the topmost surface is less than a maximum width of the bottommost surface; a top electrode over the phase change material; and a polymeric coating on outer sidewalls of the phase change material, wherein the polymeric coating separates the phase change material from an inter-layer dielectric layer.

In yet other embodiments, the present disclosure relates to a method of forming an integrated chip, comprising: depositing a phase change material layer over a bottom electrode, wherein the phase change material layer is configured to change its degree of crystallinity upon temperature changes; depositing a top electrode layer over the phase change material layer; patterning the top electrode layer to remove outer portions of the top electrode layer and expose outer portions of the phase change material; and performing an isotropic etch using a noble gas that is selective to the phase change material layer, wherein the isotropic etch comprises a first step followed by a second step, wherein the first step is conducted at a first pressure, wherein the second step is conducted at a second pressure less than the first pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising: depositing a phase change material layer over a bottom electrode, wherein the phase change material layer is configured to change its degree of crystallinity upon temperature changes; depositing a top electrode layer over the phase change material layer; depositing a hard mask layer over the top electrode layer; patterning the top electrode layer and the hard mask layer to remove outer portions of the top electrode layer and expose outer portions of the phase change material layer; and performing an isotropic etch to at least partially remove the outer portions of the phase change material layer that are uncovered by a patterned the top electrode layer and a patterned the hard mask layer, wherein the isotropic etch removes the outer portions of the phase change material layer faster than edge portions of the patterned top electrode layer and the patterned hard mask layer; wherein the isotropic etch removes the edge portions of the patterned hard mask layer faster than the edge portions of the patterned top electrode layer.

2. The method of claim 1, wherein the isotropic etch uses a noble gas.

3. The method of claim 1, further comprising:
   forming an upper dielectric layer over a hard mask created from the patterned hard mask layer;

patterning the upper dielectric layer and the hard mask to form an opening in the upper dielectric layer and hard mask that exposes an upper surface of a top electrode created from the top patterned electrode layer; and forming a via within the opening to directly contact the upper surface of the top electrode.

4. The method of claim 3, further comprising:

forming a polymeric coating over the hard mask, the top electrode, and a phase change material created during the isotropic etch from an etched phase change material layer, before forming the upper dielectric layer, wherein portions of the polymeric coating are patterned when the upper dielectric layer and the hard mask are patterned.

5. The method of claim 1, wherein the isotropic etch comprises a dry etchant, wherein the isotropic etch comprises a first step followed by a second step, wherein the first step is conducted at a first pressure, and wherein the second step is conducted at a second pressure less than the first pressure.

6. The method of claim 5, wherein the first and second steps are repeated multiple times until the phase change material layer is created into a phase change material with a trapezoidal-like shape, wherein an upper surface of the phase change material is narrower than a lower surface of the phase change material.

7. A method of forming an integrated chip, comprising:

depositing a phase change material layer over a bottom electrode, wherein the phase change material layer is configured to change its degree of crystallinity upon temperature changes;

depositing a top electrode layer over the phase change material layer;

patterning the top electrode layer to remove outer portions of the top electrode layer and expose outer portions of the phase change material layer; and performing an isotropic etch using a noble gas that is selective to the phase change material layer, wherein the isotropic etch comprises a first step followed by a second step, wherein the first step is conducted at a first pressure, and wherein the second step is conducted at a second pressure less than the first pressure.

8. The method of claim 7, wherein after performing the isotropic etch, a bottommost surface of a phase change material created from the phase change material layer is wider than a topmost surface of the phase change material.

9. The method of claim 7, wherein the isotropic etch is repeated multiple times until an etched phase change material layer exhibits a trapezoidal-like shape.

10. The method of claim 7, wherein after performing the isotropic etch, an etched phase change material layer has a topmost surface that is above a bottom surface of a top electrode created from the top electrode layer.

11. The method of claim 7, further comprising:

depositing a hard mask layer over the top electrode layer; and patterning the hard mask layer to remove outer portions of the hard mask layer and expose the outer portions of the phase change material layer, wherein after the isotropic etch, a bottom surface of a hard mask created from the hard mask layer directly contacts a top surface of a top electrode created from the top electrode layer, and wherein the bottom surface of the hard mask is narrower than the top surface of the top electrode.

12. The method of claim 7, further comprising:

depositing a hard mask layer over the top electrode layer; and depositing a polymeric coating over a hard mask created from the hard mask layer, a top electrode created from the top electrode layer, and a phase change material created from the phase change material layer, wherein the polymeric coating is deposited in-situ with the isotropic etch.

13. The method of claim 12, wherein the polymeric coating comprising carbon and hydrogen, and wherein the polymeric coating has a lower thermal conductivity than the phase change material layer.

14. The method of claim 11, wherein the isotropic etch removes portions of the hard mask layer faster than the top electrode layer.

15. A method of forming an integrated chip, comprising:

forming a phase change material layer over a bottom electrode;

forming a top electrode layer over the phase change material layer;

forming a hard mask layer over the top electrode layer;

patterning the top electrode layer and the hard mask layer to expose outer portions of the phase change material layer;

performing an isotropic etch selective to the phase change material layer, wherein the isotropic etch comprises multiple cycles, and wherein each cycle comprises a first step conducted at a first pressure followed by a second step conducted at a second pressure different than the first pressure; and forming a polymeric coating over a hard mask made from the hard mask layer, a top electrode made from the top electrode layer, and a phase change material made from the phase change material layer.

16. The method of claim 15, wherein after the isotropic etch, a topmost surface of the phase change material is narrower than a bottommost surface of the phase change material.

17. The method of claim 15, further comprising:

forming an encapsulation layer over the polymeric coating, wherein the encapsulation layer comprises a different material than the polymeric coating.

18. The method of claim 15, further comprising:

forming a via through the polymeric coating and the hard mask to contact the top electrode.

19. The method of claim 15, wherein the first pressure is greater than the second pressure.

20. The method of claim 15, wherein the isotropic etch removes the phase change material layer faster than the hard mask layer.

* * * * *